(12) United States Patent
Chang

(10) Patent No.: US 7,603,771 B2
(45) Date of Patent: Oct. 20, 2009

(54) METHOD OF MANUFACTURING A COMBINED MULTILAYER CIRCUIT BOARD HAVING EMBEDDED CHIPS

(75) Inventor: Roger Chang, Taoyuan Hsien (TW)

(73) Assignee: Mutual-Tek Industries Co., Ltd. (TW)

( * ) Notice: Subject to any disclaimer, the term of this patent is extended or adjusted under 35 U.S.C. 154(b) by 319 days.

(21) Appl. No.: 11/511,462

(22) Filed: Aug. 29, 2006

(65) Prior Publication Data
US 2008/0057627 A1    Mar. 6, 2008

(51) Int. Cl.
*H01K 3/10* (2006.01)
(52) U.S. Cl. .............................. 29/852; 29/841; 29/846; 174/262; 257/724
(58) Field of Classification Search ........... 29/830–832, 29/841, 846–849, 852; 174/260, 262; 257/691, 257/723, 724, 774; 438/118, 127
See application file for complete search history.

(56) References Cited
U.S. PATENT DOCUMENTS
5,280,192 A * 1/1994 Kryzaniwsky .............. 257/723
6,489,685 B2 * 12/2002 Asahi et al. ................. 257/774
7,047,634 B2 * 5/2006 Nakamura ................... 29/832

* cited by examiner

*Primary Examiner*—Donghai D. Nguyen
(74) *Attorney, Agent, or Firm*—Hershkovitz & Associates, LLC; Abraham Hershkovitz

(57) ABSTRACT

A method of providing at least two multilayer circuit boards, combining the at least two multilayer circuit boards to form a combined multilayer circuit board, and forming multiple outer conductive vias, circuits and contacts on the combined multilayer circuit board. Each multilayer circuit board is fabricated by the steps of preparing a single-layer printed circuit board having multiple chip sections, attaching at least one chip to the corresponding chip section, attaching a frame having multiple enclosures to the single-layer printed circuit board, attaching a semi-fluid glue sheet to the frame, vacuum pressing a conductive layer on the semi-fluid glue sheet and forming multiple conductive inner vias through the multilayer circuit board. The at least two multilayer circuit boards are combined by steps of reversing one of the multilayer circuit boards and vacuum pressing other multilayer circuit boards on the reversed multilayer circuit board.

3 Claims, 14 Drawing Sheets

METHOD OF MANUFACTURING A COMBINED MULTILAYER CIRCUIT BOARD HAVING EMBEDDED CHIPS

BACKGROUND OF THE INVENTION

1. Field of the Invention

The present invention relates to a method, and more particularly to a method of manufacturing a combined multilayer circuit board, wherein the combined multilayer circuit board has chips embedded therein.

2. Description of Related Art

Passive elements, such as resistors or capacitors, are mounted upon the conventional circuit boards, such as motherboards or printed circuit boards. However, the advancement of semiconductor technology has resulted in electronic products being smaller and more multi-function. The more functions the circuit boards have, the more passive elements are necessary. Smaller size and multi-function electronic products are in opposite positions.

To overcome these shortcomings, the present invention provides a method of manufacturing a combined multilayer circuit board having embedded chips to mitigate or obviate the aforementioned problems.

SUMMARY OF THE INVENTION

The main objective of the invention is to provide a method of manufacturing a combined multilayer circuit board, wherein the multilayer circuit board has chips embedded therein.

A method in accordance with the present invention comprises the acts of (a) providing at least two multilayer circuit boards, (b) combining the at least two multilayer circuit boards to form a combined multilayer circuit board, (c) forming multiple outer conductive vias in the combined multilayer circuit board, and (d) forming circuits and contacts on the combined multilayer circuit board. In the (a) act, each multilayer circuit board is fabricated by the steps of (a1) preparing a single-layer printed circuit board having multiple chip sections, (a2) attaching at least one chip to the corresponding chip sections of the single-layer printed circuit board, (a3) attaching a frame having multiple enclosures to the single-layer printed circuit board, (a4) attaching a semi-fluid glue sheet to the frame, (a5) vacuum pressing a conductive layer on the semi-fluid glue sheet and (a6) forming multiple conductive inner vias through the multilayer circuit board. The (b) act comprises the steps of (b1) reversing one of the multilayer circuit boards and (b2) vacuum pressing other multilayer circuit boards on the reversed multilayer circuit board. The (c) act drills multiple through holes through the combined multilayer circuit board and then electroplates peripheries defining the through holes to form multiple outer conductive vias. The (d) act etches pattern on the conductive layers and coats an insulating lacquer layer on a portion of the patterned conductive layers.

Other objectives, advantages and novel features of the invention will become more apparent from the following detailed description when taken in conjunction with the accompanying drawings.

DETAILED DESCRIPTION OF PREFERRED EMBODIMENT

Figure 1:
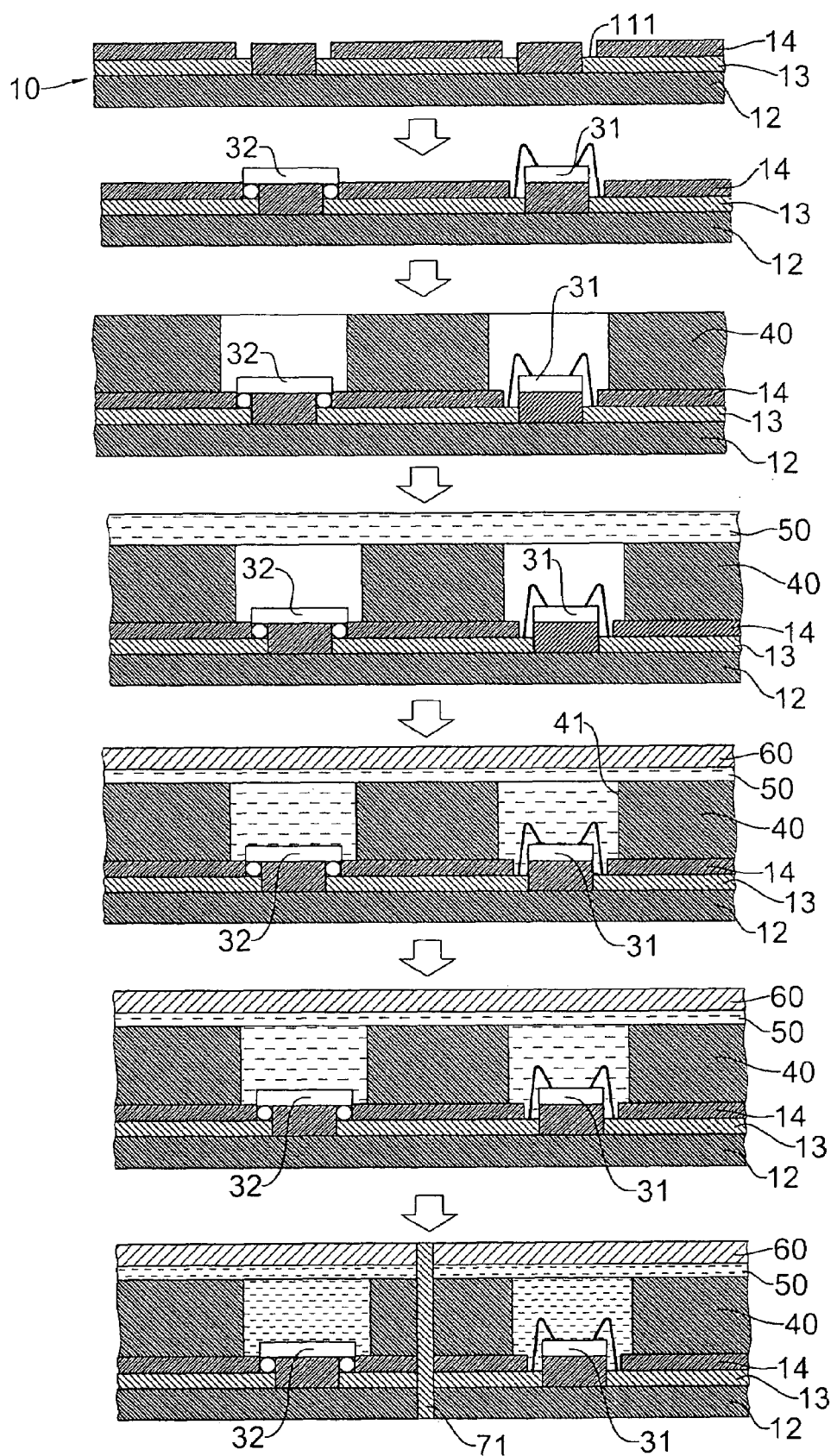
FIG. 1 is a fabricating flow of manufacturing a multilayer circuit board consisting of a single-layer Flame Retardant 4 (FR4) printed circuit board by a first embodiment of a manufacturing method in accordance with the present invention.

A first embodiment of a method for manufacturing a combined multilayer circuit board having embedded chips in accordance with the present invention comprises the acts of (a) providing two multilayer circuit boards, (b) combining the two multilayer circuit boards to form a combined multilayer circuit board, (c) forming multiple outer conductive vias in the combined multilayer circuit board, and (d) forming circuits and contacts on the combined multilayer circuit board.

In the (a) act, the two multilayer circuit boards are different and respectively fabricated by two specific fabricating processes.

With reference to FIGS. 1-4, one specific fabricating process of one multilayer circuit board has the steps of:

(a11) preparing a single-layer FR4 printed circuit (10) having multiple chip sections (11) respectively having a FR4 substrate (12), multiple conducting wires (13), and an insulating coating (14) with multiple contacts (111), (a12) attaching at least one chip (31, 32) to the corresponding chip sections (11) of the single-layer FR4 printed circuit board (10), (a13) attaching a frame (40) having multiple enclosures (41) to the single-layer FR4 printed circuit board (10), (a14) attaching a semi-fluid glue sheet (50) to the frame (40), (a15) vacuum pressing a conductive layer (60) on the semi-fluid glue sheet (50), and (a16) forming multiple conductive inner vias (71) through the multilayer circuit board.

Figure 2:
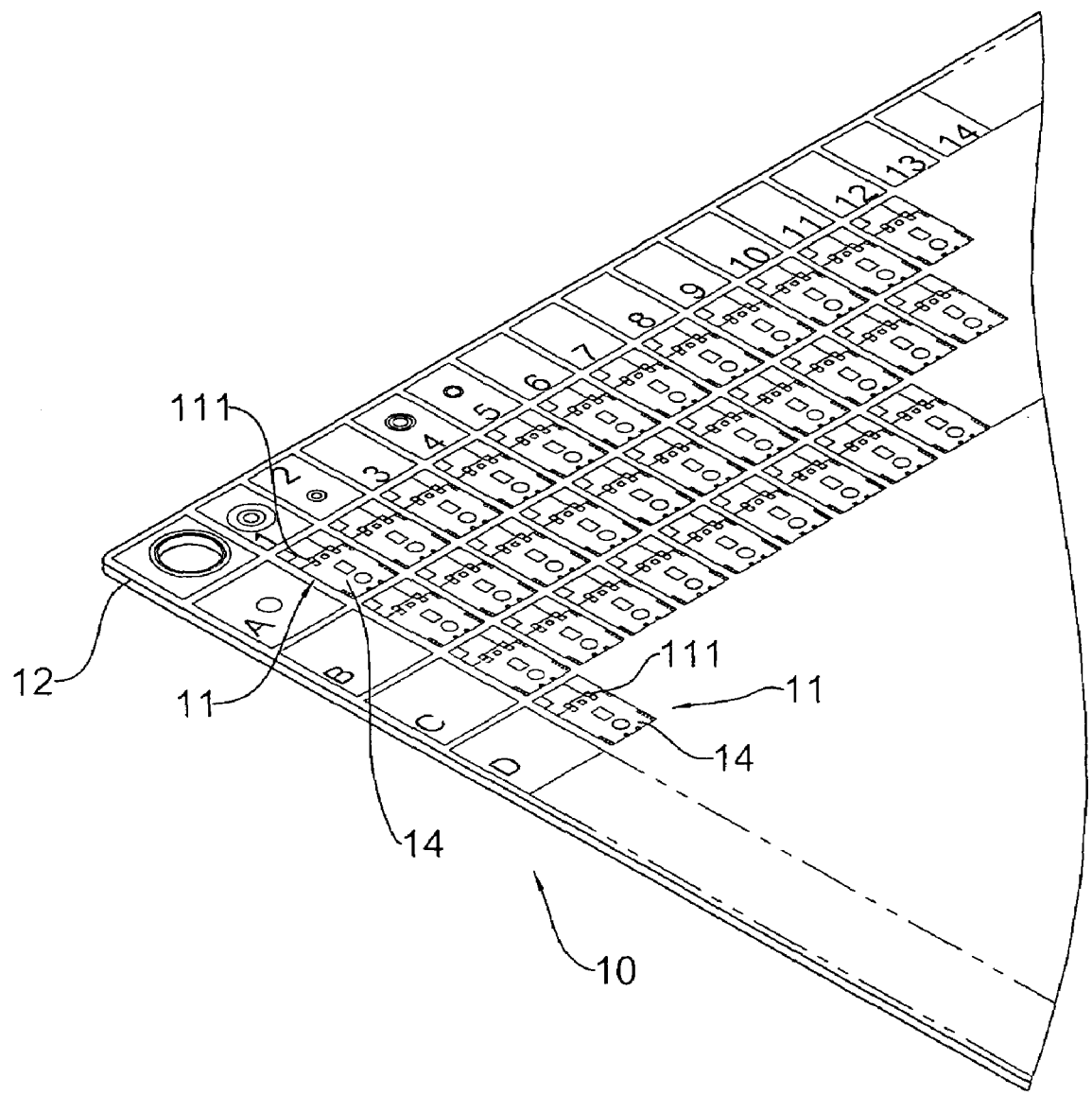
FIG. 2 is a partial perspective top view of the single-layer FR4 printed circuit board as shown in FIG. 1.
Figure 3:
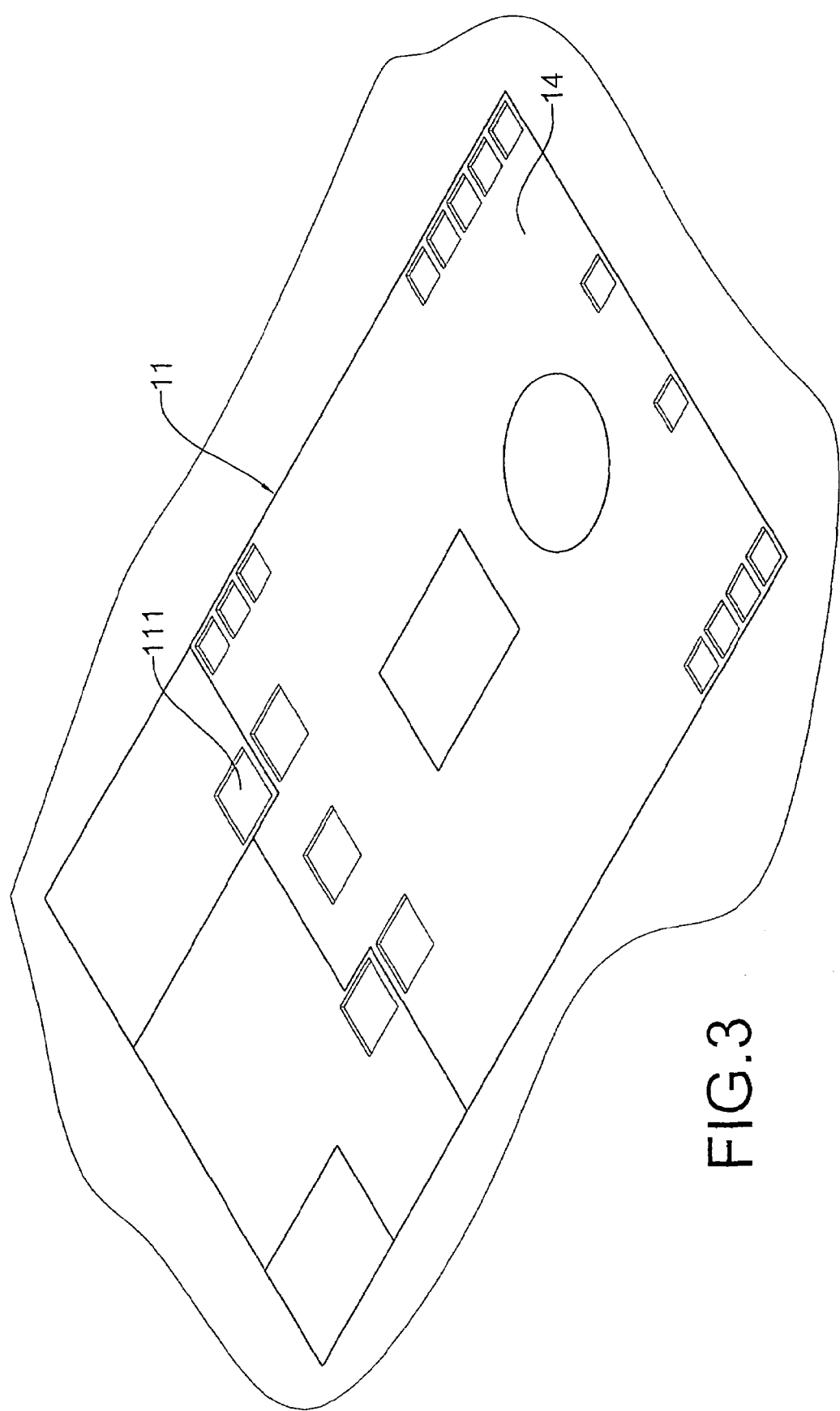
FIG. 3 is a partial perspective top view of a chip section of the single-layer FR4 printed circuit board as shown in FIG. 2.

With reference to FIGS. 1-3, in the (a11) step, the multiple chip sections (11) are arranged in matrix on the single-layer FR4 printed circuit board (10). The multiple conducting wires (13) are formed on the FR4 substrate (12) of each chip section (11). Each insulting coating (14) is coated on a portion of the multiple conducting wires (13) on each chip section (11). The contacts (111) are defined as the exposed portion of the multiple conducting wires (13).

The (a12) step attaches one chip (31, 32) to the corresponding chip section (11) of the single-layer FR4 printed circuit board (10). Each chip (31, 32) is electronically connected to the contacts (111) by a wire bonding or a solder bump bonding, and may be a chip-size resistor or a chip-size capacitor.

Figure 4:
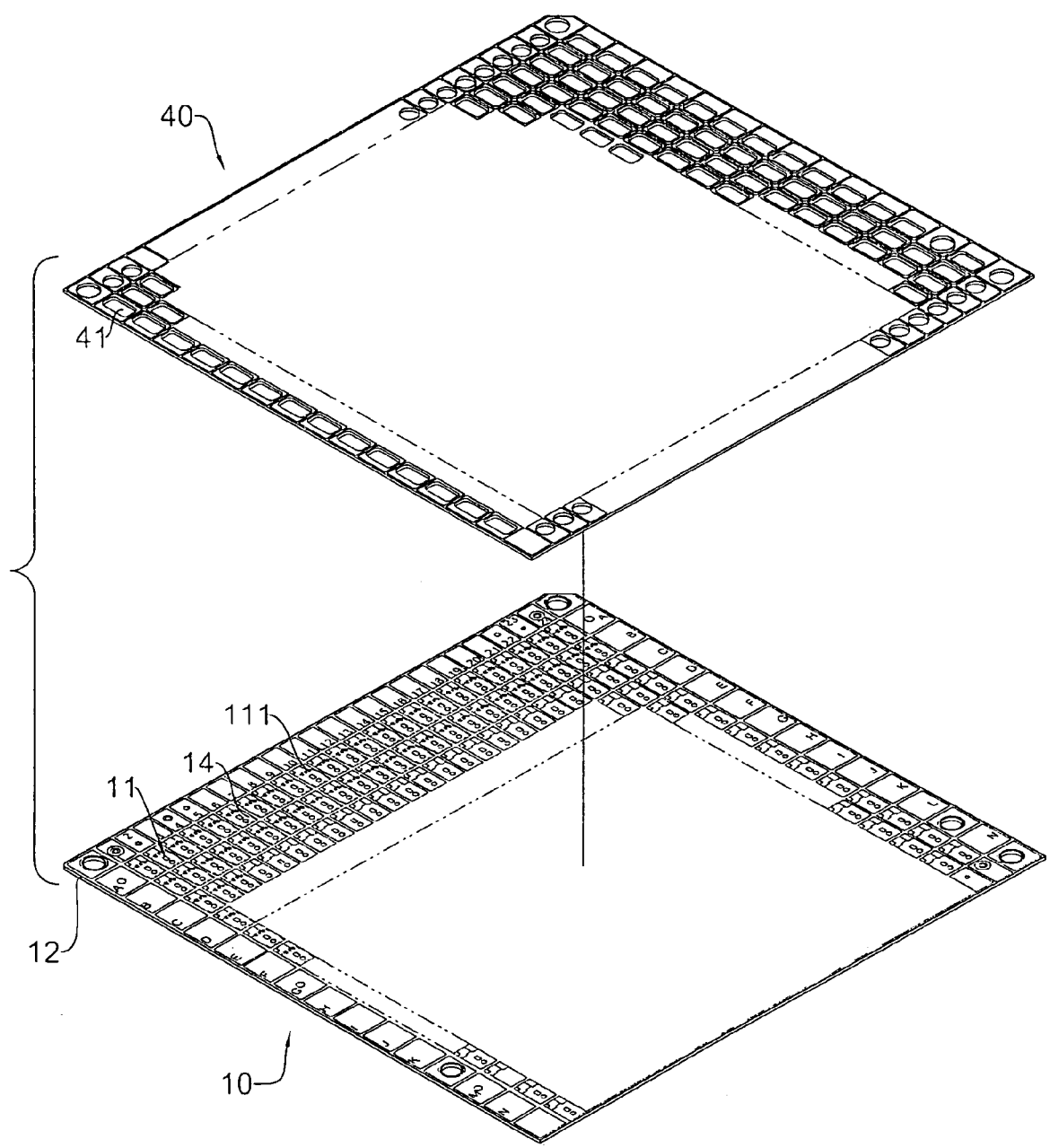
FIG. 4 is an exploded perspective view of the FR4 printed circuit board as shown in FIG. 2 with a frame.

With reference to FIG. 4, the (a13) step attaches a frame (40) to the single-layer FR4 printed circuit board (10). The frame (40) has multiple enclosures (41), and each enclosure (41) corresponds to one chip section (11) on the single-layer FR4 printed circuit board (10) to enclose the corresponding chip section (11) and the corresponding chip (31, 32).

The (a14) step attaches a semi-fluid glue sheet (50) to the frame (40) to cover the frame (40).

The (a15) step vacuum presses a conductive layer (60) on the semi-fluid glue sheet (50) to fill inside of the enclosures (41) with glue of the semi-fluid glue sheets (50) to encapsulate the chips (31, 32). Furthermore, each conductive layer (60) can be used to form a circuitry or terminals later.

The (a16) step drills multiple holes through the FR4 substrate (12), the conducting wires (13), the insulating coating (14), the frame (40), the semi-fluid glue sheet (50) and the conductive layer (60) in the multilayer circuit board, and then electroplates peripheries defining the holes to form multiple inner conductive vias (71). The inner conductive vias (71) electronically connect the conducting wires (13) to the conductive layer (60) in the multilayer circuit board.

Figure 5:
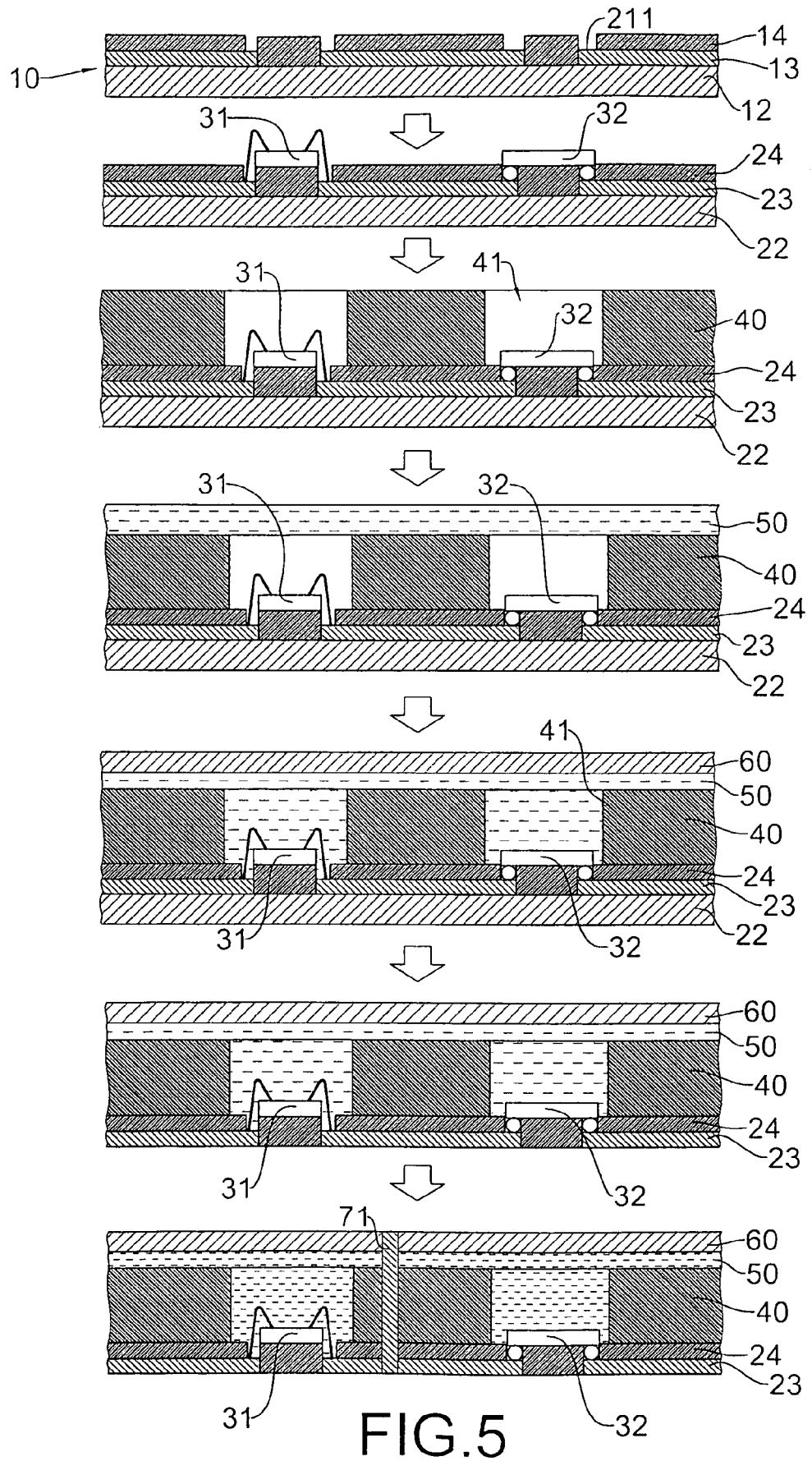
FIG. 5 is a fabricating flow of manufacturing another multilayer circuit board consisting of a single-layer copper plate printed circuit board by a first embodiment of a manufacturing method in accordance with the present invention.
Figure 6:
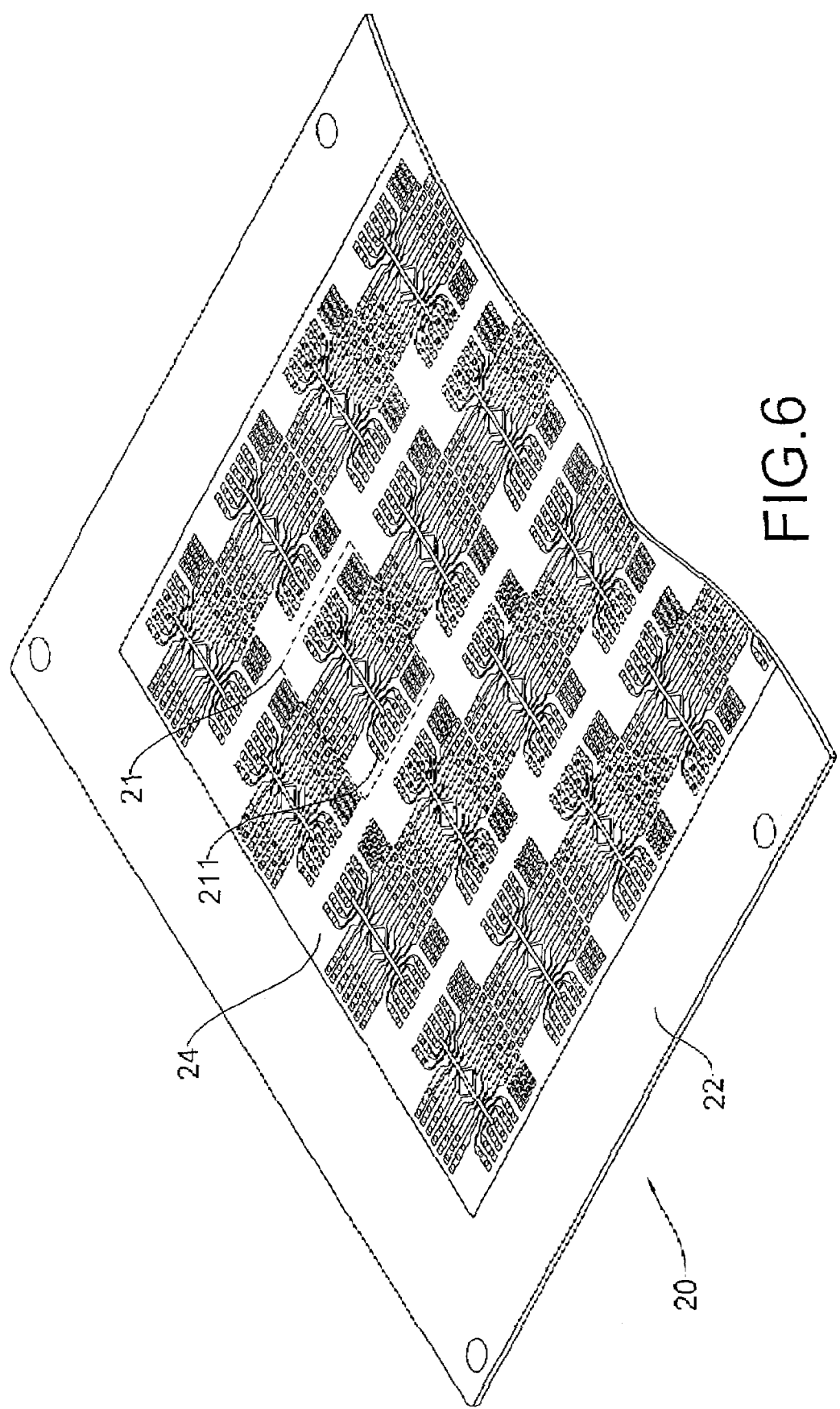
FIG. 6 is a partial perspective top view of the single-layer copper plate printed circuit board as shown in FIG. 5.
Figure 7:
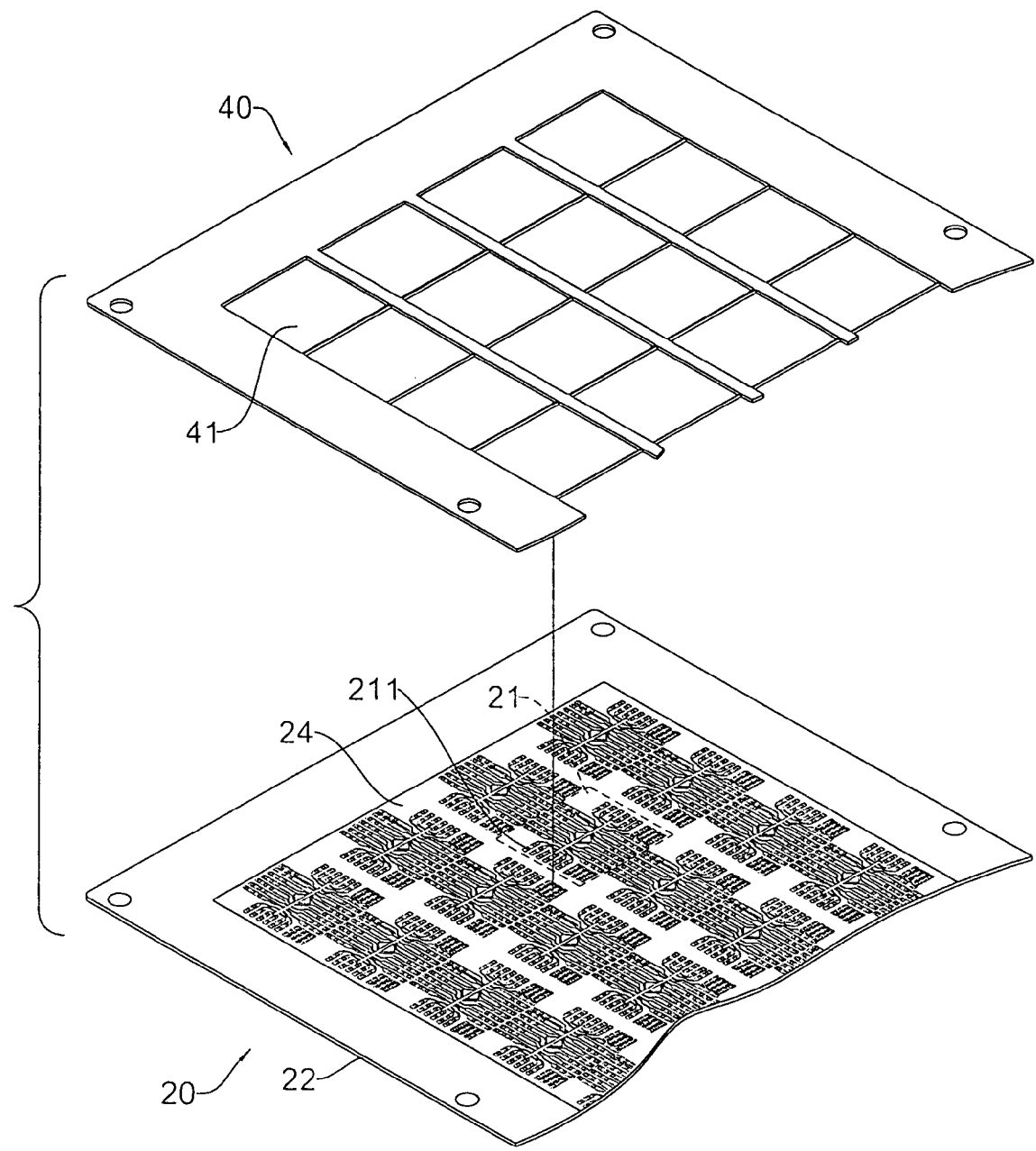
FIG. 7 is an exploded perspective view of the copper plate printed circuit board as shown in FIG. 6 with a frame.

With reference to FIGS. 5-7, another specific fabricating process is used to fabricate the other multilayer circuit board in (a) act and has steps of:

(a21) preparing a single-layer copper plate printed circuit board (20) having multiple chip sections (21) respectively having a copper plate substrate (22), multiple conducting wires (23), an insulating coating (24) and multiple contacts (211), (a22) attaching at least one chip (31, 32) to the corresponding chip section (21) of the single-layer copper plate printed circuit board (20), (a23) attaching a frame (40) having multiple enclosures (41) to the single-layer copper plate printed circuit board (20), (a24) attaching a semi-fluid glue sheet (50) to the frame (40), (a25) vacuum pressing a conductive layer (60) on the semi-fluid glue sheet (50), (a26) removing the copper plate substrate, and (a27) forming multiple conductive inner vias (71) through the multilayer circuit board.

With reference to FIGS. 5 and 6, in the (a21) step, the multiple chip sections (21) are arranged in matrix on the single-layer copper plate printed circuit board (20). The multiple conducting wires (23) are formed on the copper plate substrate (22) of each chip section (21). Each insulating coating (24) is coated on a portion of the multiple conducting wires (23) on each chip section (21). The contacts (211) are defined as the exposed portion of the multiple conducting wires (23).

The (a22) step attaches one chip (31, 32) to the corresponding chip section (21) of the single-layer copper plate printed circuit board (20). Each chip (31, 32) is electronically connected to the contacts (211) by a wire bonding or a solder bump bonding.

With reference to FIG. 7, the (a23) step attaches a frame (40) to the single-layer copper plate printed circuit board (20). The frame (40) has multiple enclosures (41), and each enclosure (41) corresponds to one chip section (21) on the single-layer copper plate printed circuit board (20) to enclose the corresponding chip section (21) and the chip (31, 32).

The (a24) step attaches a semi-fluid glue sheet (50) to the frame (40) to cover the frame (40).

The (a25) step vacuum presses a conductive layer (60) on the semi-fluid glue sheet (50) to fill inside of the enclosures (41) with glue of the semi-fluid glue sheets (50) to encapsulate the chips (31, 32). Furthermore, each conductive layer (60) can be used to form a circuitry or terminals later.

The (a26) step removes the copper plate substrate (22) of the single-layer copper plate printed circuit board (20) by an etching process.

The (a27) step drills multiple holes through the copper plate substrate (22), the conducting wires (23), the insulating coating (24), the frame (40), the semi-fluid glue sheet (50) and the conductive layer (60) in the multilayer circuit board, and then electroplates peripheries defining the holes to form multiple inner conductive vias (71). The inner conductive vias (71) electronically connect the conducting wires (23) to the conductive layer (60) in the multilayer circuit board.

Figure 8:
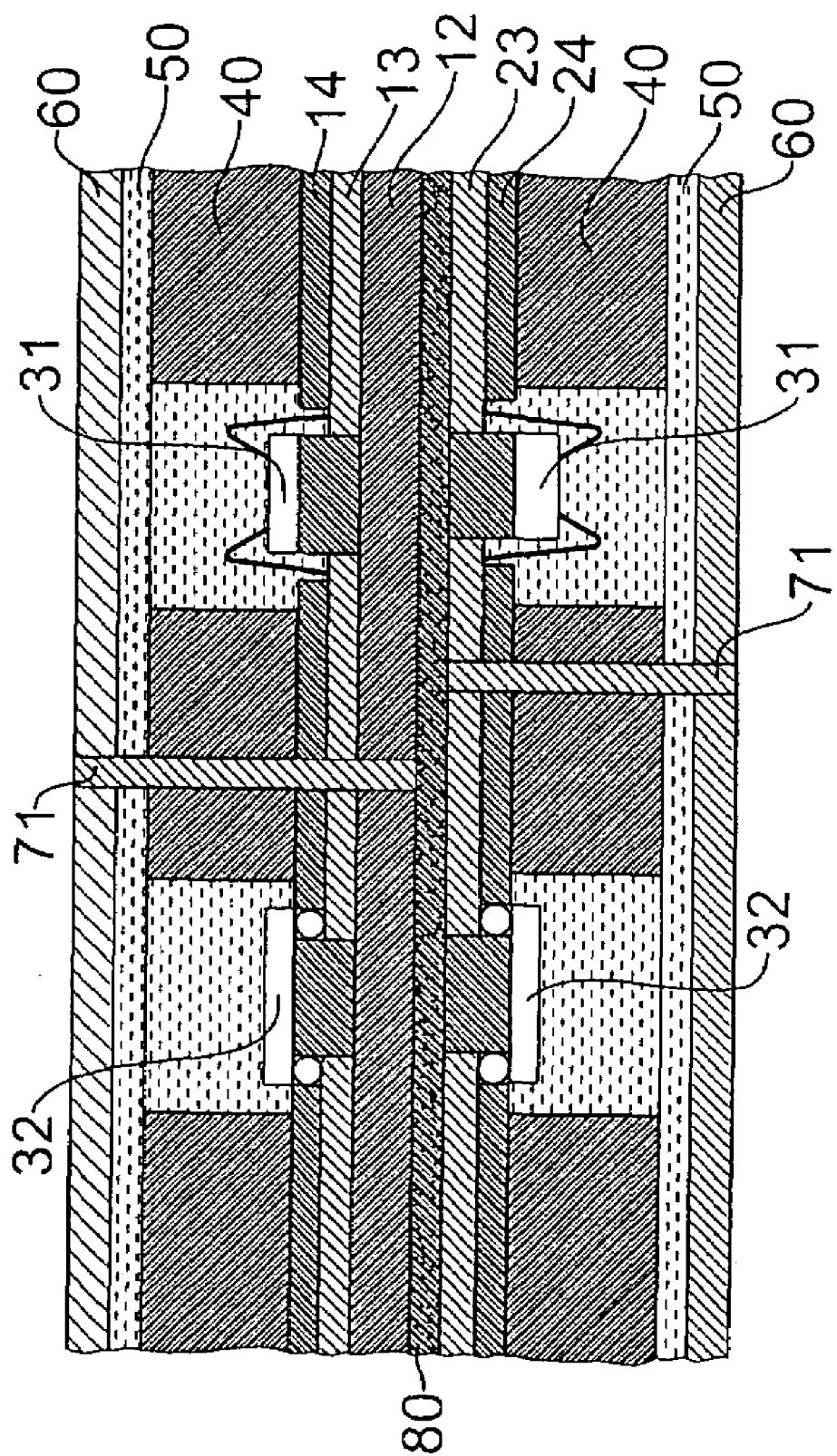
FIG. 8 is a side view in partial section of a first embodiment of a combined multilayer circuit board fabricated with the multilayer circuit boards as shown in FIGS. 1 and 5 by the first embodiment of the manufacturing method in accordance with the present invention.

With reference to FIG. 8, the (b) act comprises the steps of (b1) reversing one of the multilayer circuit boards and (b2) vacuum pressing other multilayer circuit boards on the reversed multilayer circuit board.

The (b1) step reverses the multilayer circuit board consisting of the single-layer copper plate printed circuit board (20).

The (b2) step vacuum presses the un-reversed multilayer circuit board consisting of the single-layer FR4 printed circuit board (10) and the reversed multilayer circuit boards consisting of the single-layer copper plate printed circuit board (20) together with a glue layer (80). The glue layer (80) is sandwiched between the two multilayer circuit boards to adhere the two multilayer circuit boards to each other. Therefore, a combined multilayer circuit board is almost finished.

Figure 9:
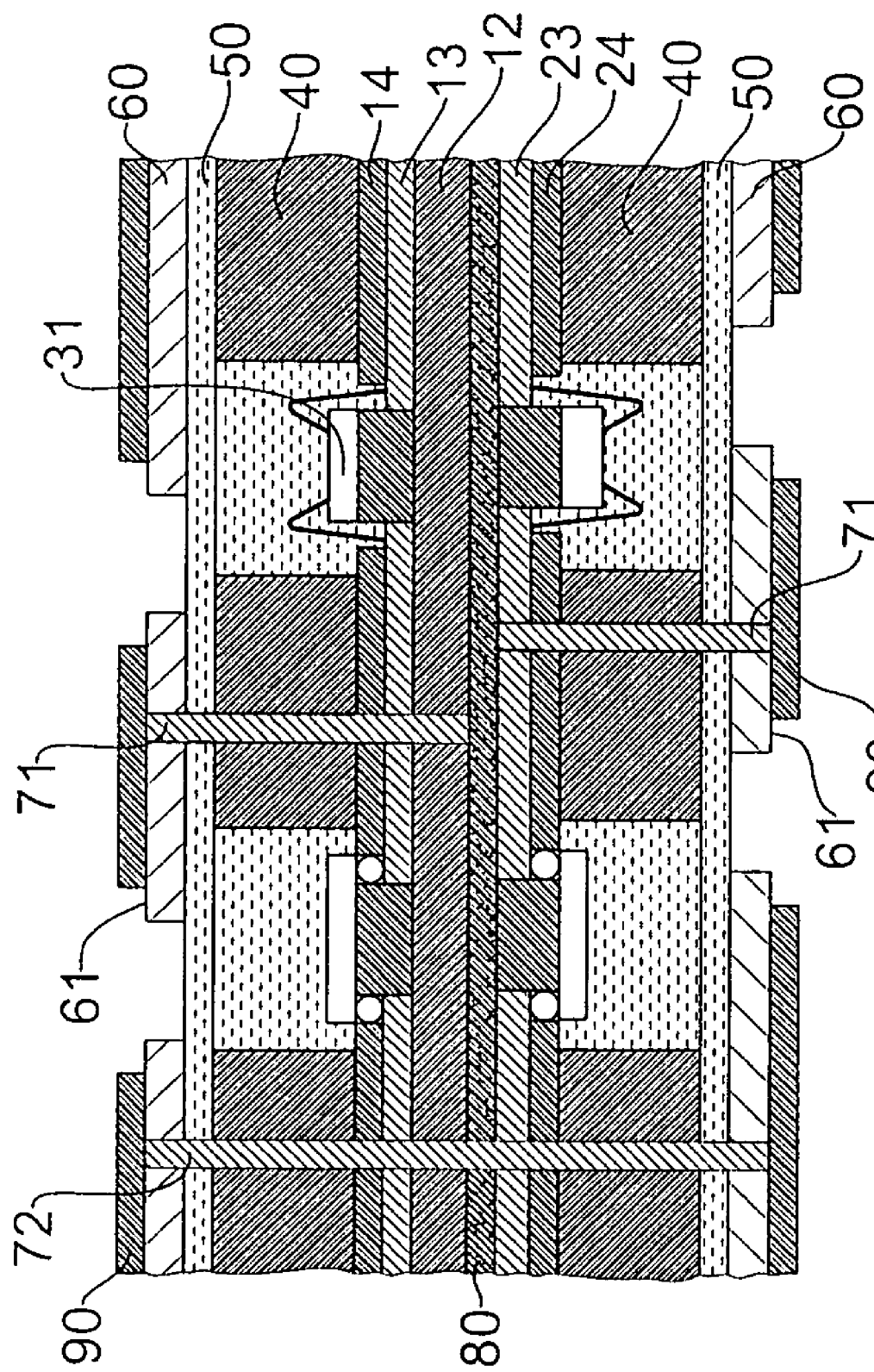
FIG. 9 is a side view in partial section of the combined multilayer circuit board as shown in FIG. 8 with multiple outer conductive vias, patterned conductive layers and insulating lacquer layer.

With reference to FIG. 9, the (c) act drills multiple through holes through the combined multilayer circuit board and then electroplates peripheries defining the through holes to form multiple outer conductive vias (72). Each outer conductive via (72) electronically interconnects to the conducting wires (13, 23) and the conductive layers (60) in the two multilayer circuit boards.

Figure 10:
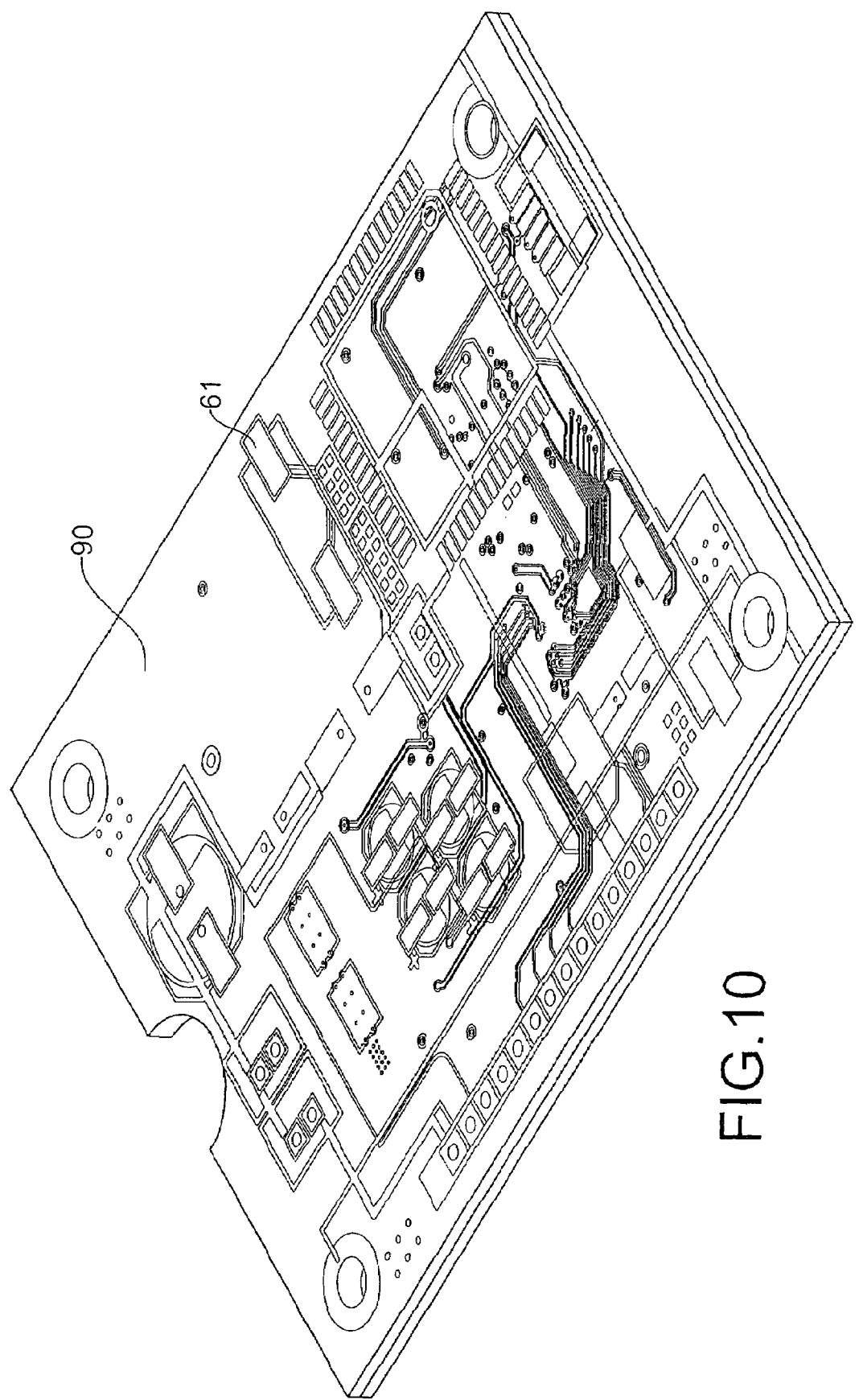
FIG. 10 is a perspective view of the combined multilayer circuit board as shown in FIG. 9.
Figure 11:
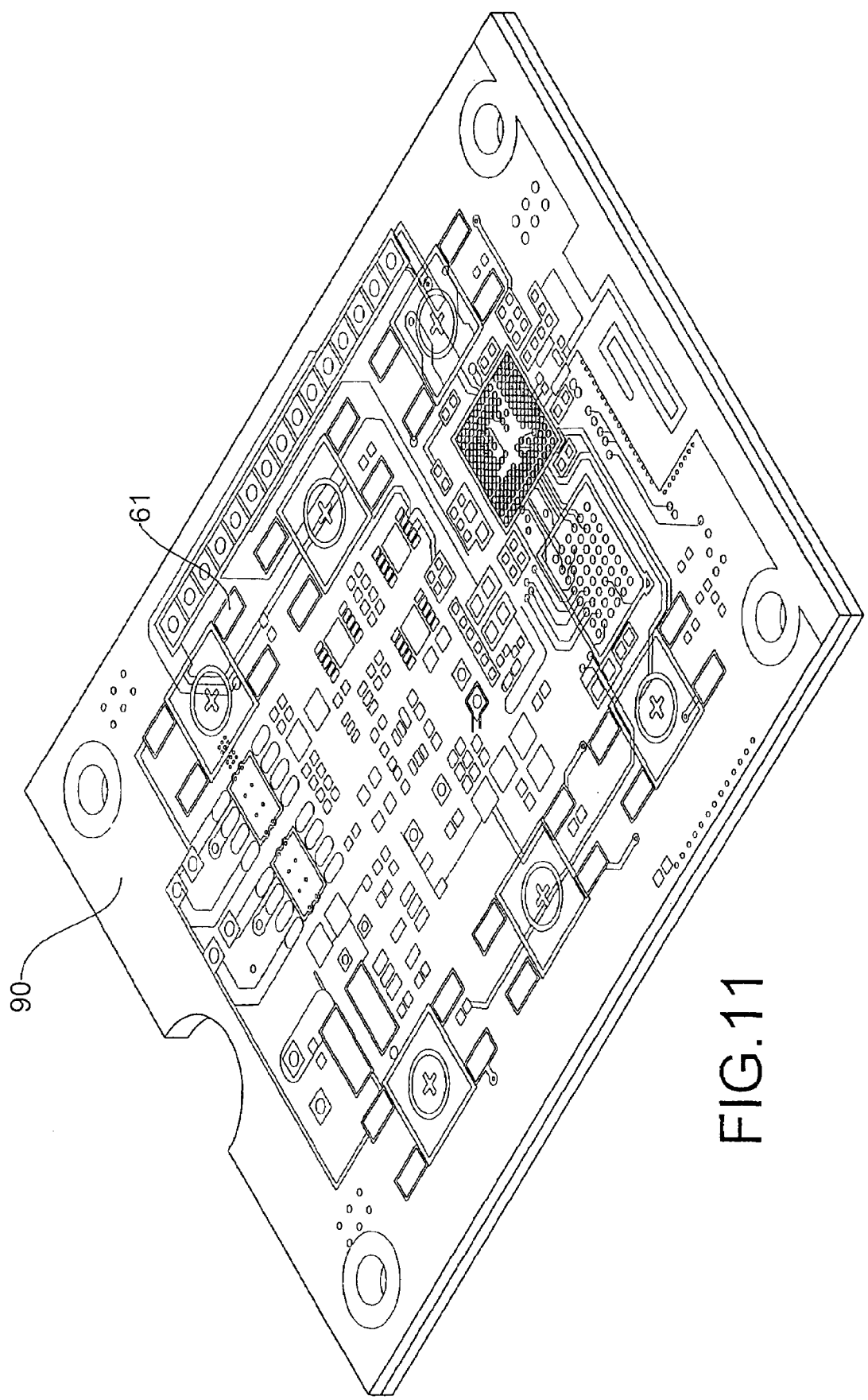
FIG. 11 is a reverse perspective view of the combined multilayer circuit board as shown in FIG. 10.

The (d) act etches patterns on the conductive layers (60) and coats an insulating lacquer layer (90) on a portion of the patterned conductive layers (60) to finish the combined multilayer circuit board. With further reference to FIGS. 10 and 11, the patterned conductive layers (60) become circuits and the patterned conductive layer un-coated with the insulating lacquer layer (90) become contacts (61).

Figure 12:
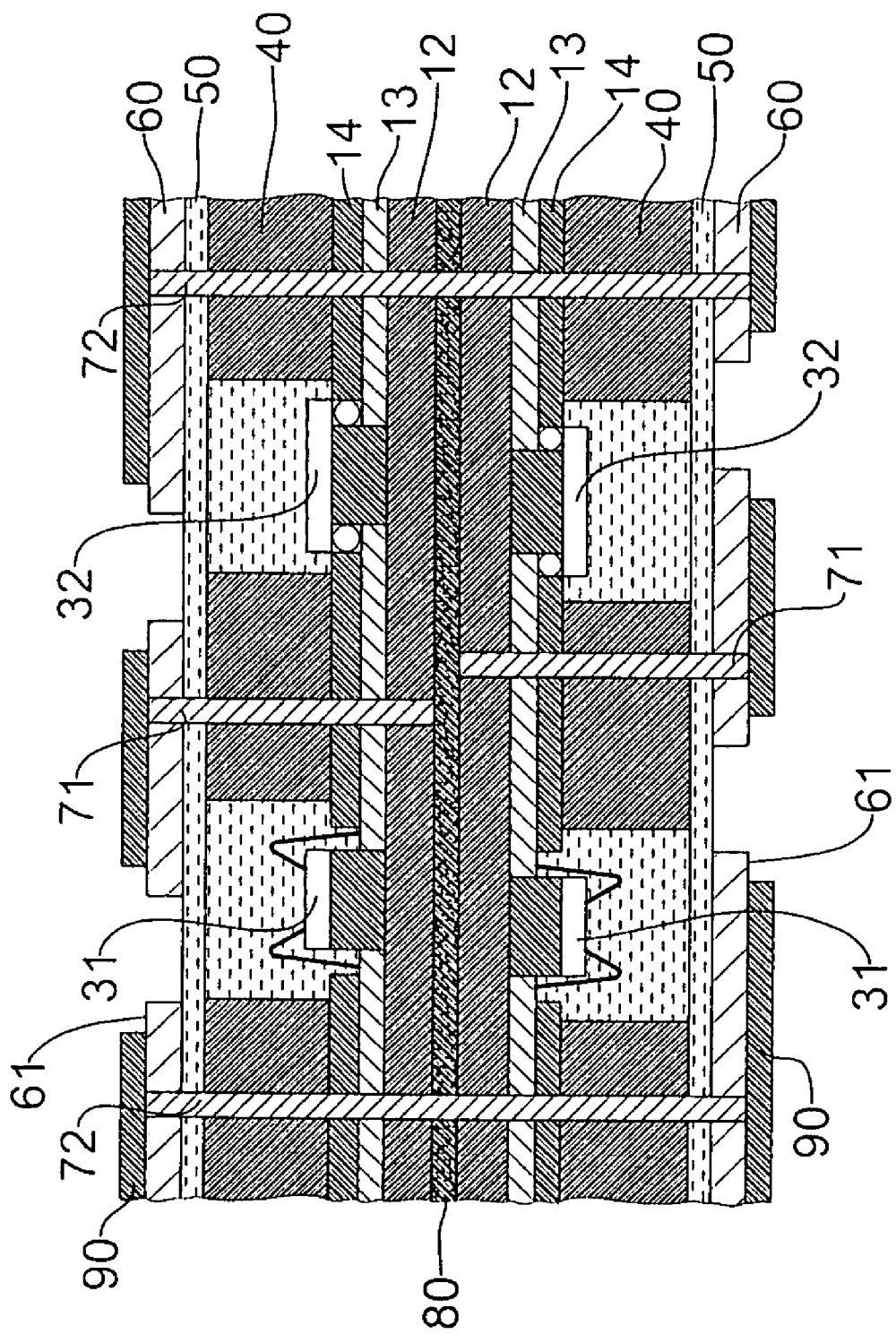
FIG. 12 is a side view in partial section of a second embodiment of a combined multilayer circuit board manufactured by a second embodiment of a manufacturing method in accordance with the present invention.

With further reference to FIG. 12, a second embodiment of the manufacturing method in accordance with the present invention comprises mostly the same acts as the acts of the first embodiment of the manufacturing method. The second embodiment of the manufacturing method uses two single-layer FR4 printed circuit boards (10).

Figure 13:
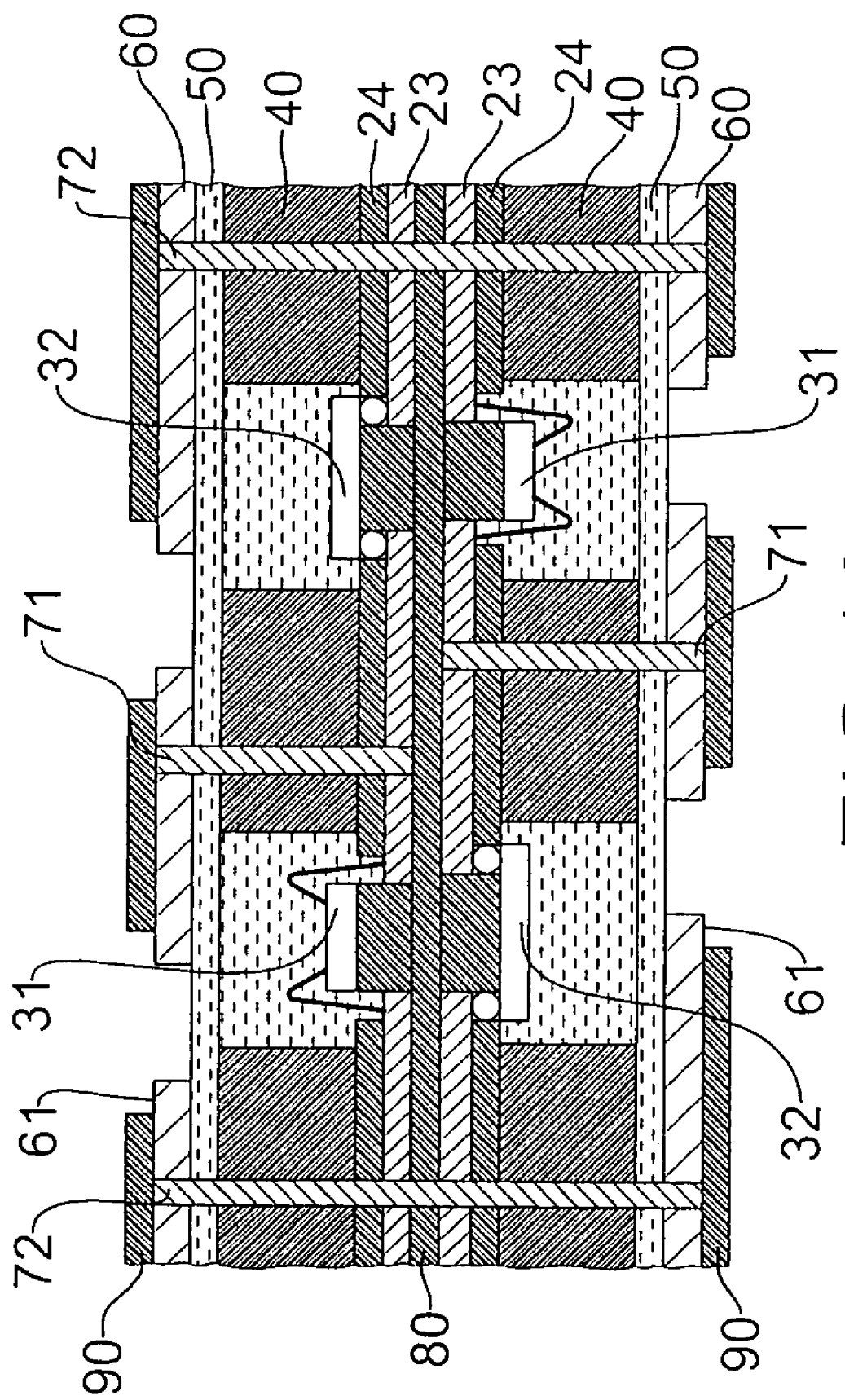
FIG. 13 is a side view in partial section of a third embodiment of a combined multilayer circuit board manufactured by a third embodiment of a manufacturing method in accordance with the present invention.

With further reference to FIG. 13, a third embodiment of the manufacturing method in accordance with the present invention comprises mostly the same acts as the acts of the first embodiment of the manufacturing method. The third embodiment of the manufacturing method uses two single-layer copper plate printed circuit boards (20).

Figure 14:
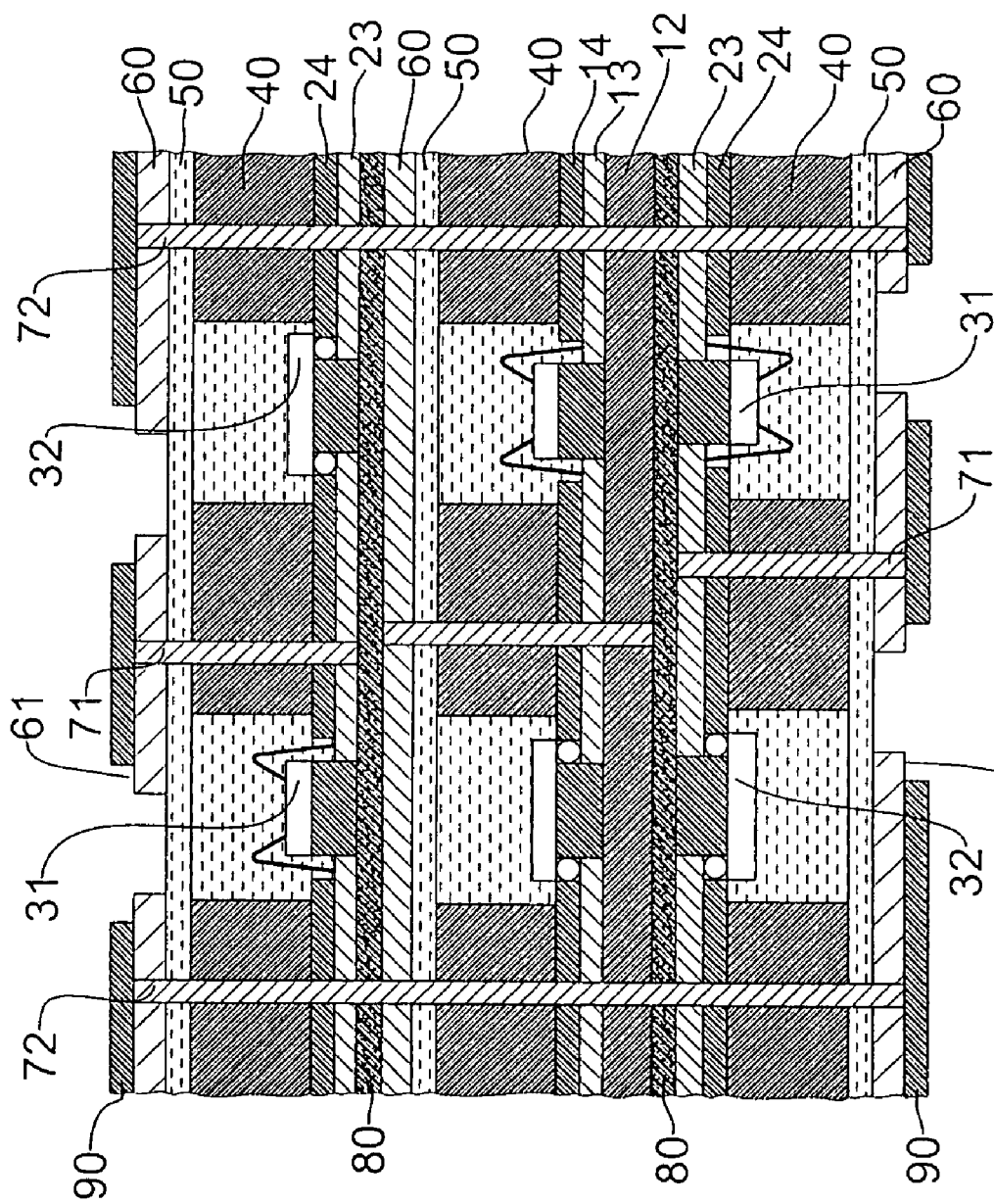
FIG. 14 is a side view in partial section of a fourth embodiment of a combined multilayer circuit board manufactured by a fourth embodiment of a manufacturing method in accordance with the present invention.

With further reference to FIG. 14, the fourth embodiment of the manufacturing method in accordance with the present invention comprises mostly the same acts as the acts of the first embodiment of the manufacturing method. The fourth embodiment of the manufacturing method uses three multilayer circuit boards. Two of the three multilayer circuit boards are fabricated by using two single-layer copper plate printed circuit boards (20), and the other multilayer circuit board is fabricated by using single-layer FR4 printed circuit board (10). One of the multilayer circuit boards consisting of the single-layer copper plate printed circuit board (20) is reversed. The multilayer circuit board consisting of the single-layer FR4 printed circuit board (10) is sandwiched in between the multilayer circuit boards consisting of the single-layer copper plate printed circuit boards (20).

With such a method, a combined multilayer circuit board is manufactured. The combined multilayer circuit board is not only a circuit board, but also a circuit board that has multiple chips embedded in it. The combined circuit board can be a motherboard, a printed circuit board or the like. Therefore, most of the passive elements are mounted in the combined circuit board. Furthermore, the combined multilayer circuit board manufactured by the method in accordance with the present invention provides more multi-function than the conventional multi-chips module but without larger size.

Even though numerous characteristics and advantages of the present invention have been set forth in the foregoing description, together with details of the structure and function of the invention, the disclosure is illustrative only. Changes may be made in detail, especially in matters of arrangement of parts within the principles of the invention to the full extent indicated by the broad general meaning of the terms in which the appended claims are expressed.

What is claimed is:

1. A method of manufacturing a combined multilayer circuit board having embedded chips comprising:
   (a) providing at least two multilayer circuit boards, wherein each multilayer circuit board is fabricated by:
      (a1) preparing a single-layer Flame Retardant 4 (FR4) printed circuit board having multiple chip sections arranged in matrix, and each chip section having a FR4 substrate;
         multiple conducting wires formed on the FR4 substrate of each chip section;
         an insulating coating coated on a portion of the multiple conducting wires; and
         multiple contacts defined as the exposed portion of the multiple conducting wires;
      (a2) attaching at least one chip to the corresponding chip section of the single-layer FR4 printed circuit board, wherein each chip is electronically connected to the contacts on the corresponding single-layer FR4 printed circuit board;
      (a3) attaching a frame to the single-layer FR4 printed circuit board, wherein the frame has multiple enclosures corresponding to the chip sections on the single-layer FR4 printed circuit board to enclose the corresponding chip section and the corresponding chip;
      (a4) attaching a semi-fluid glue sheet to the frame to cover the frame;
      (a5) vacuum pressing a conductive layer on the semi-fluid glue sheet to fill inside of the enclosures with glue of the semi-fluid glue sheet to encapsulate the chips; and
      (a6) forming multiple inner conductive vias by drilling multiple holes through the multilayer circuit board and then electroplating the peripheries defining the holes to electronically connect the conducting wires to the conductive layer in the multilayer circuit board;
   (b) combining the at least two multilayer circuit boards to form a combined multilayer circuit board, wherein the of combining comprises:
      (b1) reversing one of the multilayer circuit boards; and
      (b2) vacuum pressing other multilayer circuit boards on the reversed multilayer circuit board with multiple glue layers, and each glue layer sandwiched in between two multilayer circuit boards;
   (c) forming multiple outer conductive vias by drilling multiple through holes through the combined multilayer circuit board and then electroplating the peripheries defining the through holes to electronically interconnect the conducting wires and the conductive layers in the at least two multilayer circuit boards; and
   (d) forming circuits and contacts on the combined multilayer circuit board by etching patterns on the conductive layers and coating an insulating lacquer layer on a portion of the patterned conductive layers.

2. A method of manufacturing a combined multilayer circuit board having embedded chips comprising:
   (a) providing at least two multilayer circuit boards, wherein each multilayer circuit board is fabricated by:
      (a1) preparing a single-layer copper plate printed circuit board having multiple chip sections arranged in matrix, and each chip section having
         a copper plate substrate;
         multiple conducting wires formed on the copper plate substrate of each chip section;
         an insulating coating coated on a portion of the multiple conducting wires; and
         multiple contacts defined as the exposed portion of the multiple conducting wires;
      (a2) attaching at least one chip to the corresponding chip section of the single-layer copper plate printed circuit board, wherein each chip is electronically connected to the contacts on the corresponding single-layer copper plate printed circuit board;
      (a3) attaching a frame to the single-layer copper plate printed circuit board, wherein the frame has multiple enclosures corresponding to the chip sections on the single-layer copper plate printed circuit board to enclose the corresponding chip section and the corresponding chip;
      (a4) attaching a semi-fluid glue sheet to the frame to cover the frame;
      (a5) vacuum pressing a conductive layer on the semi-fluid glue sheet to fill the inside of the enclosures with the glue of the semi-fluid glue sheet to encapsulate the chips;
      (a6) removing the copper plate substrate of the single-layer copper plate printed circuit board; and
      (a7) forming multiple inner conductive vias by drilling multiple holes through the multilayer circuit board and then electroplating the peripheries defining the holes to electronically connect the conducting wires to the conductive layer in the single-layer copper plate printed circuit board;
   (b) combining the at least two multilayer circuit boards to form a combined multilayer circuit board, wherein the combining comprises:
      (b1) reversing one of the multilayer circuit boards; and (b2) vacuum pressing other multilayer circuit boards on the reversed multilayer circuit board with multiple glue layers, and each glue layer sandwiched in between the two multilayer circuit boards;

(c) forming multiple outer conductive vias by drilling multiple through holes through the combined multilayer circuit board and then electroplating peripheries defining the through holes to electronically interconnect the conducting wires and the conductive layers in the at least two multilayer circuit boards; and (d) forming circuits and contacts on the combined multilayer circuit board by etching patterns on the conductive layers and coating an insulating lacquer layer on a portion of the patterned conductive layers.

3. A method of manufacturing a combined multilayer circuit board having embedded chips comprising:

(a) providing at least two multilayer circuit boards, wherein at least one of the multilayer circuit boards is fabricated by:

(a11) preparing a single-layer Flame Retardant (FR4) printed circuit board having multiple chip sections arranged in matrix, and each chip section having
a FR4 substrate;
multiple conducting wires formed on the FR4 substrate of each chip section;
an insulating coating coated on a portion of the multiple conducting wires; and
multiple contacts defined as the exposed portion of the multiple conducting wires;

(a12) attaching at least one chip to the corresponding chip section of the single-layer FR4 printed circuit board, wherein each chip is electronically connected to the contacts on the corresponding single-layer FR4 printed circuit board;

(a13) attaching a frame to the single-layer FR4 printed circuit board, wherein the frame has multiple enclosures corresponding to the chip sections on the single-layer FR4 printed circuit board to enclose the corresponding chip section and the corresponding chip;

(a14) attaching a semi-fluid glue sheet to the frame to cover the frame;

(a15) vacuum pressing a conductive layer on the semi-fluid glue sheet to fill inside of the enclosures with glue of the semi-fluid glue sheet to encapsulate the chips; and (a16) forming multiple inner conductive vias by drilling multiple holes through the multilayer circuit board and then electroplating the peripheries defining the holes to electronically connect the conducting wires to the conductive layer in the multilayer circuit board; and at least one of the other multilayer circuit boards is fabricated by:

(a21) preparing a single-layer copper plate printed circuit board having multiple chip sections arranged in matrix, and each chip section having
a copper plate substrate;
multiple conducting wires formed on the copper plate substrate of each chip section;
an insulating coating coated on a portion of the multiple conducting wires; and
multiple contacts defined as the exposed portion of the multiple conducting wires;

(a22) attaching at least one chip to the corresponding chip sections of the single-layer copper plate printed circuit board, wherein each chip is electronically connected to the contacts on the corresponding single-layer copper plate printed circuit board;

(a23) attaching a frame to the single-layer copper plate printed circuit board, wherein the frame has multiple enclosures corresponding to the chip sections on the single-layer copper plate printed circuit board to enclose the corresponding chip section and the corresponding chip;

(a24) attaching a semi-fluid glue sheet to the frame to cover the frame;

(a25) vacuum pressing a conductive layer on the semi-fluid glue sheet to fill inside of the enclosures with the glue of the semi-fluid glue sheet to encapsulate the chips;

(a26) removing the copper plate substrate of the single-layer copper plate printed circuit board; and (a27) forming multiple inner conductive vias by drilling multiple holes through the multilayer circuit board and then electroplating the peripheries defining the holes to electronically connect the conducting wires to the conductive layer in the single-layer copper plate printed circuit board;

(b) combining the at least two multilayer circuit boards to form a combined multilayer circuit board, wherein the combining comprises:

(b1) reversing one of the multilayer circuit boards; and (b2) vacuum pressing other multilayer circuit boards on the reversed multilayer circuit board with multiple glue layers, and each glue layer being sandwiched in between the two multilayer circuit boards;

(c) forming multiple outer conductive vias by drilling multiple through holes through the combined multilayer circuit board and then electroplating the peripheries defining the through holes to electronically interconnect the conducting wires and the conductive layers in the at least two multilayer circuit boards; and (d) forming circuits and contacts on the combined multilayer circuit board by etching patterns on the conductive layers and coating an insulating lacquer layer on a portion of the patterned conductive layers.

* * * * *